(12) United States Patent
Koestler et al.

(10) Patent No.: US 10,916,677 B2
(45) Date of Patent: Feb. 9, 2021

(54) OPTOCOUPLER

(71) Applicant: AZUR SPACE SOLAR POWER GMBH, Heilbronn (DE)

(72) Inventors: Wolfgang Koestler, Heilbronn (DE); Daniel Fuhrmann, Heilbronn (DE); Wolfgang Guter, Stuttgart (DE); Clemens Waechter, Lauffen am Neckar (DE); Christoph Peper, Hannover (DE)

(73) Assignee: AZUR SPACE Solar Power GmbH, Heilbronn (DE)

(*) Notice: Subject to any disclaimer, the term of this patent is extended or adjusted under 35 U.S.C. 154(b) by 306 days.

(21) Appl. No.: 16/059,538

(22) Filed: Aug. 9, 2018

(65) Prior Publication Data

US 2018/0374982 A1 Dec. 27, 2018

Related U.S. Application Data

(63) Continuation of application No. PCT/EP2017/000120, filed on Feb. 2, 2017.

(30) Foreign Application Priority Data

Feb. 9, 2016 (DE) .................. 10 2016 001 388

(51) Int. Cl.
*H01L 31/167* (2006.01)
*H01L 31/101* (2006.01)
(Continued)

(52) U.S. Cl.
CPC ........ *H01L 31/167* (2013.01); *H01L 31/0203* (2013.01); *H01L 31/1013* (2013.01); *H03K 17/78* (2013.01); *H04B 10/802* (2013.01)

(58) Field of Classification Search
CPC ... H03K 17/78; H01L 31/0687; H04B 10/802
See application file for complete search history.

(56) References Cited

U.S. PATENT DOCUMENTS 3,321,631 A 5/1967 Biard
3,818,451 A 6/1974 Coleman
(Continued)

FOREIGN PATENT DOCUMENTS

DE 2310053 A1 9/1973
DE 69421884 T2 5/2000
(Continued)

OTHER PUBLICATIONS

International Search Report dated May 22, 2017 in corresponding application PCT/EP2017/000120.
(Continued)

*Primary Examiner* — Thanh Luu
(74) *Attorney, Agent, or Firm* — Muncy, Geissler, Olds & Lowe, P.C.

(57) ABSTRACT

An optocoupler having a transmitter unit and a receiver unit being electrically isolated from each other and optically coupled with each other and integrated into a shared housing. The receiver unit includes an energy source that has a first electrical contact and a second electrical contact. The transmitter unit includes at least one first transmitter diode having a first optical wavelength and a second transmitter diode having a second optical wavelength. The first optical wavelength differing from the second optical wavelength by a difference wavelength, and the energy source of the receiving unit including two partial sources. The energy source being designed as a current source or as a voltage source, and the first partial source including a first semiconductor diode, and the second partial source including a second semiconductor diode. Each partial source having multiple semiconductor layers for each partial source being arranged in the shape of a stack.

10 Claims, 4 Drawing Sheets

(51) Int. Cl.
*H03K 17/78* (2006.01)
*H01L 31/0203* (2014.01)
*H04B 10/80* (2013.01)

(56) References Cited

U.S. PATENT DOCUMENTS

| | | |
|---|---|---|
| 4,127,862 A | 11/1978 | Ilegems et al. |
| 4,626,878 A | 12/1986 | Kuwano et al. |
| 4,996,577 A | 2/1991 | Kinzer |
| 5,514,875 A | 5/1996 | Krause |
| 6,239,354 B1 | 5/2001 | Wanlass |
| 8,350,208 B1 | 1/2013 | Zhang et al. |
| 8,809,877 B2 | 8/2014 | Guo |
| 2006/0048811 A1 | 3/2006 | Krut et al. |
| 2017/0098635 A1* | 4/2017 | Chen ............... H01L 25/167 |

FOREIGN PATENT DOCUMENTS

| | | |
|---|---|---|
| DE | 102010001420 A1 | 8/2011 |
| JP | 55-016408 A | 2/1980 |
| WO | WO2013067969 A1 | 5/2013 |

OTHER PUBLICATIONS

Kalkhoran et al, "Cobald disilicide intercell ohmic contacts for multijunction photovoltaic energy converters", Appl. Phys. Lett 64 (15). Apr. 11, 1994, pp. 1980-1982.

Bett et al, "III-V Solar Cells under Monochromatic Illumination", Photovoltaic Specialists Conference, 2008, ISBN 978-1-4244-1641—Jul. 8, 2008 33$^{rd}$ IEEE, pp. 1-5.

Unlu et al, "Wavelength Selective Optical Logic and Interconnects", 8106 IEEE Journal of Quantum Electronics Feb. 29, 1993, No. 2, New York, US.pp. 411-425.

\* cited by examiner

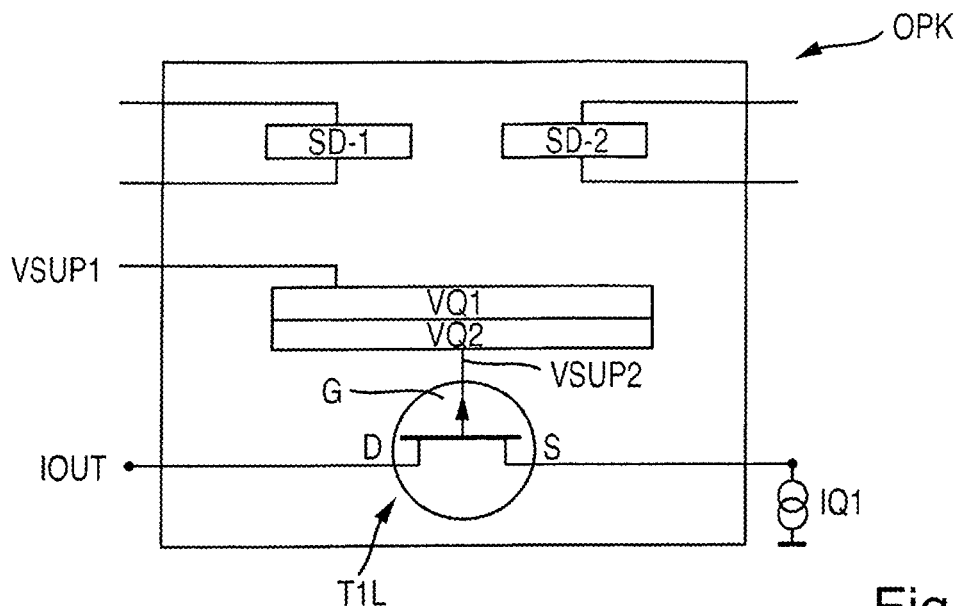
Fig. 7
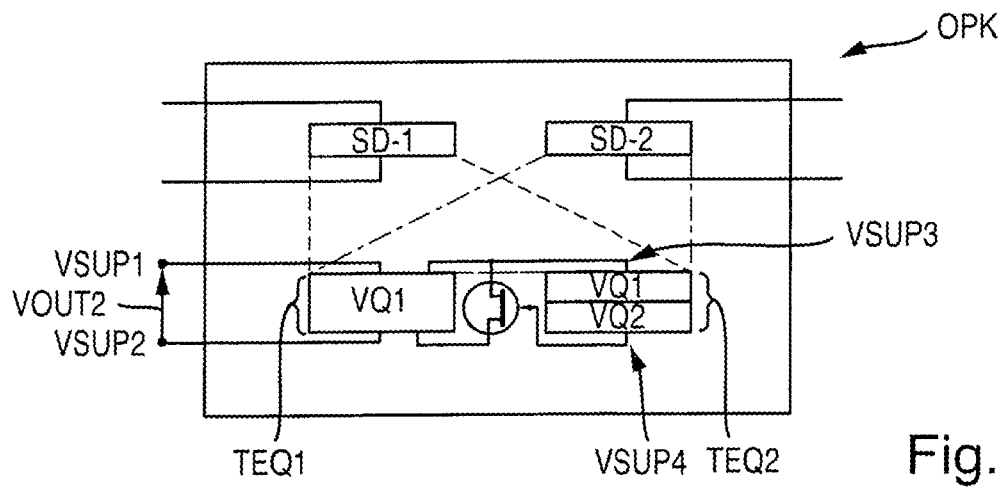
Fig. 8
| SD1 | SD2 | IOUT1 | VOUT1 | IOUT2 | VOUT2 |
|-----|-----|-------|-------|-------|-------|
| 1 | 1 | 1 | 1 | 0 | 0 |
| 1 | 0 | 0 | 1 | 0 | 1 |
| 0 | 1 | 0 | 1 | 0 | 1 |
| 0 | 0 | 0 | 0 | 1 | 0 |
|   |   | AND | OR | NOR | XOR |
Fig. 9

OPTOCOUPLER

This nonprovisional application is a continuation of International Application No. PCT/EP2017/000120, which was filed on Feb. 2, 2017, and which claims priority to German Patent Application No. 10 2016 001 388.5, which was filed in Germany on Feb. 9, 2016, and which are both herein incorporated by reference.

BACKGROUND OF THE INVENTION

Field of the Invention

The present invention relates to an optocupler.

Description of the Background Art

Optocoupler are known. Simple optocouplers include a transmitter unit and a receiver unit, the two units being electrically isolated but optically coupled. Components of this type are known from U.S. Pat. No. 4,996,577. Optical components are also known from US 2006/0048811 A1, U.S. Pat. No. 8,350,208 B1 and WO 2013/067969 A1.

Moreover, scalable voltage sources or solar cells made from III-V materials are known from U.S. Pat. No. 4,127,862, U.S. Pat. No. 6,239,354 B1, DE 10 2010 001 420 A1, from Nader M. Kalkhoran, et al, "Cobalt disilicide intercell ohmic contacts for multijunction photovoltaic energy converters," Appl. Phys. Lett. 64, 1980 (1994) and from A. Bett et al, "III-V solar cells under monochromatic Illumination," Photovoltaic Specialists Conference, 2008, PVSC '08. 33rd IEEE, pages 1-5. ISBN: 978-1-4244-1640-0.

Other arrangements of optical components are known from DE 2 310 53, DE 694 21 884 T2 (which corresponds to U.S. Pat. No. 5,514,875), U.S. Pat. No. 4,626,878, JP 55 016 408 A1 and U.S. Pat. No. 3,321,631.

SUMMARY OF THE INVENTION

It is therefore an object of the present invention to provide a device which refines the prior art.

In an exemplary embodiment of the invention, an optocoupler is provided, which includes a transmitter unit and a receiver unit, the transmitter unit and the receiver unit being electrically isolated from each other and optically coupled with each other and being integrated into a shared housing, and the receiver unit including an energy source having a first electrical terminal contact and a second electrical terminal contact.

The transmitter unit can include at least one first transmitter diode, having a first optical wavelength and a second transmitter diode having a second optical wavelength.

The first optical wavelength can differ from the second optical wavelength by a difference wavelength. The energy source of the receiver unit includes two partial sources and is designed as a current source or as a voltage source. The first partial source includes a first semiconductor diode, and the second partial source includes a second semiconductor diode.

Each partial source can have multiple semiconductor layers, the semiconductor layers for each partial source being arranged in the shape of a stack, and each partial source having an upper side and an underside.

The first semiconductor diode can have an absorption edge adapted to the first optical wavelength, and the second semiconductor diode has an absorption edge adapted to the second optical wavelength, so that the first partial source generates energy when irradiated with the first optical wavelength, and the second partial source generates energy when irradiated with the second optical wavelength.

If the photon emission in the transmitter unit is subject to a modulation, the modulation induces a modulated direct voltage; in other words, the magnitude of the generated energy changes over time. It should furthermore be noted that the entire upper side of the two stacks is preferably irradiated with light of the first optical wavelength and/or with light of the second optical wavelength. It is also understood that the term, in a shared housing, is understood to be, in particular, a single housing, i.e. the transmitter unit and the receiver unit do not have separate housings in their own right. It is understood that die-cast housings, in particular, are understood as the housing. Housings of this type are manufactured by means of a so-called molding process.

It is also understood that the designation, optical wavelength, the light of an LED being meant in particular, is meant to be the central wavelength of a generally Gaussian spectrum, which has a half-width of 20 to 30 nm, for example, in a typical 850 nm LED. It is also understood that the photon energy corresponding to the optical wavelength is slightly greater than or equal to the band gap energy of the absorption layers of the semiconductor diodes. It should furthermore be noted that the difference, i.e. the difference wavelength, between the first optical wavelength and the second optical wavelength is at least 40 nm.

The electrical terminal of the entire receiver unit can be designated by the term, terminal contact. However, the term, contact, or the phrase, metallic contact of the electrical terminal, refers directly to a semiconductor surface. It is understood that the first terminal contact is connected exclusively to the first metallic contact, and the second terminal contact is connected exclusively to the second metallic contact.

It should be noted that is has been surprisingly shown that, in contrast to the prior art, source voltages of the individual partial sources above 1V may be advantageously generated using the present stack approach. It has also been demonstrated that a series connection of multiple semiconductor diodes adds the source voltages of the semiconductor diodes to a partial source in a first approximation. The number N of semiconductor diodes is preferably less than ten. It is understood that a tunnel diode is disposed between each of two directly consecutive semiconductor diodes.

An advantage of the device according to the invention is that, apart from the electrical supply of the transmitter diodes, a binary logic, for example an AND operation, may be simulated in many cases without an external power supply. Another advantage is that a great deal of space is saved with the aid of the stacked arrangement of semiconductor diodes, compared to the previous lateral arrangement with silicon diodes. In particular, only the much smaller receiving surface, i.e. the top side of the stack of the receiver unit, needs to be illuminated by the transmitter diode or the light source.

The two partial sources can be connected in series. This easily results in an AND logic at the output of the receiver unit or, in other words, the receiver unit supplies a voltage at the output only when both transmitter diodes illuminate the receiver unit.

The first partial source and the second partial source can be monolithically integrated. The layers of the two partial sources are preferably manufactured with the aid of a MOVPE epitaxy process. In a monolithic specific embodiment, the layers are deposited one on top of the other in the shape of a stack. The layers having the larger band gap are situated on the layers having the smaller band gap, i.e. the light irradiated onto the receiver unit first strikes the layers having the larger band gap. Alternatively, in another monolithic specific embodiment, the layers are arranged side by side on a shared carrier substrate, i.e. in two separate stacks. In this case, the light having the longer wavelength directly strikes the stack with the layers having the smaller band gap. In other words, in a design arranged side by side, the radiation strikes the particular upper side of the partial source simultaneously in both partial sources.

An underside of the first partial source can be disposed on the upper side of the second partial source, so that the two partial sources form a common stack having a front side and a back side, the first terminal contact being formed on the upper side of the first partial source, and the second terminal contact being formed on the underside of the first partial source, and a third terminal contact being formed on the underside of the second partial source, or the first terminal contact being formed on the upper side of the first partial source, and the second terminal contact being formed on the underside of the second partial source. In a Boolean representation, an AND operation may be implemented hereby, i.e. a current flows through the two series-connected partial sources only when both partial sources are illuminated.

The first partial source and the second partial source can be arranged side by side on a shared carrier, the first terminal contact being disposed on an upper side of the first partial source, and a second terminal contact being disposed on an underside of the first partial source, and a third terminal contact being disposed on the upper side of the second partial source, and a fourth terminal contact being disposed on the underside of the second partial source. In a Boolean representation, an OR operation may be implemented hereby, i.e. no voltage is present at the two parallel-connected partial sources if neither of the two partial sources is illuminated.

The first terminal contact can be disposed on an upper side of the first partial source, and the second terminal contact can be disposed on an underside of the second partial source, the underside of the first partial source being electrically connected to the upper side of the second partial source.

In a stacked arrangement of the two partial sources, the second terminal contact can be formed on the back of the stack by means of a semiconductor substrate. In other words, a metallic coating, which preferably covers the entire surface, is formed on the underside of the substrate as a metallic first contact or as a contact surface. The substrate preferably includes or is made up of germanium or GaAs or InP.

The receiver unit can include a normally-on transistor, the gate of the transistor being connected to the second terminal contact of the series-connected partial sources. The transistor is non-conductively switched when one or both partial sources generate a voltage. In a Boolean representation, a NOR operation may be implemented hereby, i.e. a current flows through the transistor only if both partial sources are not illuminated.

The receiver unit can include an evaluation unit, an electrical operative connection existing between the evaluation unit and the two partial sources, i.e. the evaluation unit is connected to both partial sources. It is preferred that the energy for operating the evaluation unit is generated exclusively by the receiver unit.

The first partial source can be made up of a large number of first diodes, and the second partial source can be made up of a large number of second diodes, the two partial sources each having a source voltage of greater than 2 volts at 300 K. It is understood that the first diodes and the second diodes are each monolithically integrated and connected one after the other, and a tunnel diode is formed between each of two consecutively arranged diodes.

The partial sources each can have a circumferential, shoulder-shaped edge in the vicinity of the underside of the stack. If the two partial sources are monolithically stacked one after the other and form a common monolithically designed stack, the circumferential, shoulder-shaped edge is formed only on the underside of the single stack. It is understood that the edge appears as a step in a cross-sectional representation. The shoulder-shaped edge or the step is formed in that the surface of the substrate is larger than the surface on the underside of the second partial source.

The first semiconductor diode and/or the second semiconductor diode include(s) or is/are made up of inGaP, and the second semiconductor diode can be made up of GaAs or InGaAs. The partial sources or the stack preferably include(s) predominantly III-V compounds. The partial sources can be predominantly made up of III-V compounds.

Multiple first partial sources and/or multiple second partial sources can be formed, the partial sources each being spatially separated. It is understood that the light of the first transmitter diode strikes the upper side of the multiple first partial sources, and the light of the second transmitter diode strikes the upper side of the multiple second partial sources. In an embodiment, the light of the first transmitter diode and the light of the second transmitter diode, each strike the upper sides of all partial sources of the partial sources arranged at the top of a stack, or in other words, if two partial sources are disposed one on top of the other, the light penetrates the upper side of the top partial source in the stack.

A transmitter diode activates multiple first or multiple second partial sources. In another refinement, the receiver unit includes a normally-off transistor.

The receiving unit can include a first partial source adjacent to a stacked arrangement of another first partial source disposed on a second partial source. The upper side of the first partial source is electrically connected to the upper side of the other first partial source and to the source of the normally-off transistor. The underside of the second partial source is connected to the gate of the normally-off transistor. The drain of the normally-off transistor is connected to the underside of the first partial source.

Also, the upper side of the first partial source can be connected to the first electrical terminal contact, and the underside of the first partial source is connected to the second electrical terminal contact. It should be noted that only the two terminal contacts of the optocoupler are available outside the housing. The internal connection is not guided to the outside, i.e. outside the housing, and is directly contactable. Studies have shown that an XOR logic is implemented with the present embodiment, a binary one being assigned to the transmission of light of the two transmitter diodes in each case. A binary one is also assigned in the case of a voltage to be measured between the two terminal contacts.

The optocouplers can be used to carry out, for example, mathematical operations and thereby a processor is not needed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 7 shows an embodiment of an optocoupler, including a normally-on transistor;

FIG. 8 shows an embodiment of an optocoupler, including a normally-off transistor and an XOR design;

FIG. 9 shows a table as a summary of the Boolean circuit variants;

DETAILED DESCRIPTION

Figure 1:
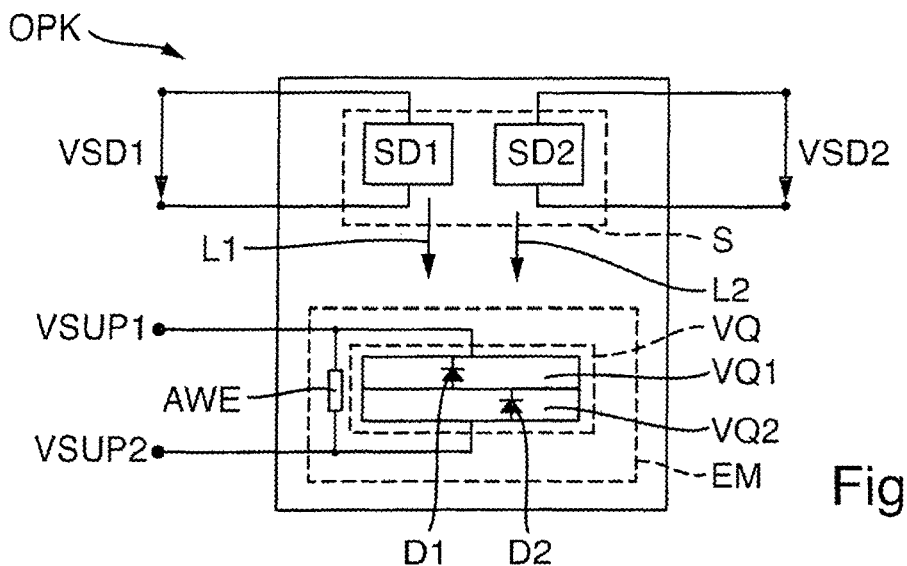
FIG. 1 shows an embodiment of an optocoupler, including a transmitter unit and a receiver unit.

The illustration in FIG. 1 shows an of an optocoupler OPK, which comprises a transmitter unit S and a receiver unit EM. It is understood that optocoupler OPK is housed, i.e. the specified components are integrated into the shared housing. If transmitter unit S transmits a modulated photon stream, the voltage and the current in receiver unit EM are also modulated.

Transmitter unit S includes a first transmitter diode SD1 and a second transmitter diode SD2. First transmitter diode SD1 has a first optical wavelength L1, and second transmitter diode SD2 has a second optical wavelength L2. The difference wavelength between the first optical wavelength and the second optical wavelength is at least 40 nm. First transmitter diode SD1 includes two terminal contacts, a first supply voltage VDS1 being present at the two terminal contacts. Second transmitter diode SD2 also includes two terminal contacts, a second supply voltage VDS2 being present at the two terminal contacts.

Receiver unit EM includes an energy source VQ and an evaluation unit AWE. Evaluation unit AWE is connected in parallel to energy source VQ. Energy source VQ includes a first partial source VQ1 and a second partial source VQ2, energy source VQ being designed as a current source or as a voltage source. First partial source VQ1 is disposed on second partial source VQ2. The two partial sources VQ1 and VQ2 form a single stack and are monolithically integrated and connected to each other in series.

Energy source VQ has an upper side and an underside and a first terminal VSUP1 connected to the upper side and a second terminal VSUP2 connected to the underside. Evaluation unit AWE is connected to first terminal VSUP1 and to second terminal VSUP2. In each case, the light of both transmitter diodes SD1 and SD2 first strikes the upper side of energy source VQ, i.e. in the present case the upper side of first partial source VQ1. It then passes through first partial source VQ1 and passes through second partial source VQ2. It is understood that first partial source VQ1 has a larger band gap than second partial source VQ2.

First partial source VQ1 includes at least one first semiconductor diode D1, and second partial source VQ2 includes at least one second semiconductor diode D2. Each of the two partial sources VQ1, VQ2 has multiple semiconductor layers, the semiconductor layers for each partial source VQ1, VQ2 being arranged in the shape of a stack, and each partial source VQ1, VQ2 having an upper side and an underside.

First semiconductor diode D1 has an absorption edge adapted to first optical wavelength L1, and second semiconductor diode D2 has an absorption edge adapted to second optical wavelength L2, so that first partial source VQ1 generates energy when irradiated with first optical wavelength L1, and second partial source VQ2 generates energy when irradiated with second optical wavelength L2.

Expressed in a Boolean representation, the current behavior between the two terminals VSUP1 and VSUP2 corresponds to an AND operation, i.e. a first current IOUT1 flowing through the two partial sources VQ1 and SQ2 may be measured between the two terminals VSUP1 and VSUP2 only when both transmitter diodes SD1 and SD2 irradiate the receiver unit.

Figure 2:
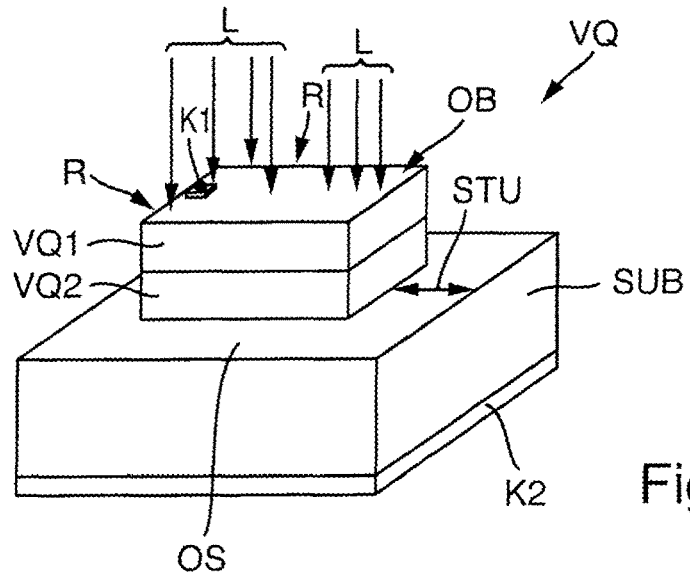
FIG. 2 shows am embodiment of the energy source from FIG. 1, including a stacked arrangement of the two partial sources on a shared substrate SUB.

The illustration in FIG. 2 shows an embodiment of an energy source VQ, which has a stacked arrangement of the two partial sources VQ1 and VQ2 and a substrate SUB. Only the differences from the illustration in FIG. 1 are explained below.

Below second partial source VQ2, substrate SUB is formed from a semiconductor material. A first metallic contact K1 is formed on the upper side of first partial source VQ1, near edge R. First contact K1 is connected to first terminal VSUP1. Substrate SUB has an upper side OS, upper side OS of substrate SUB being monolithically connected in an integral manner to underside of second partial source VQ2. It can be understood that a thin nucleation layer and a buffer layer can be epitaxially generated on substrate SUB before the layers of second partial source VQ2 are disposed on substrate SUB and integrally connected to upper side OS of substrate SUB. Upper side OS of substrate SUB has a larger surface than the surface on the underside of energy source VQ. A circumferential step STU is formed hereby. A second metallic contact K2 is formed over the entire surface on the underside of substrate SUB. Second contact K2 is connected to second terminal contact VSUP2.

Figure 3:
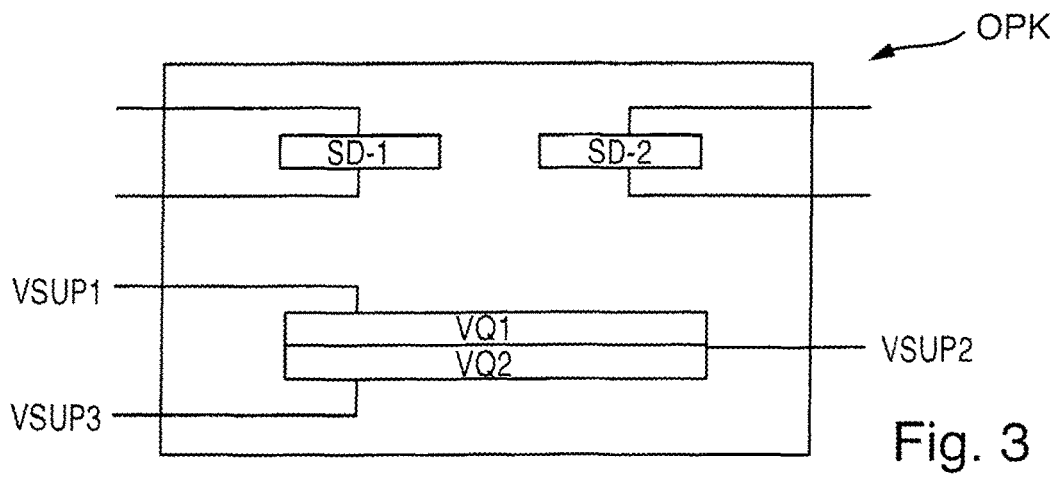
FIG. 3 shows an embodiment of an optocoupler, including a transmitter unit and a receiver unit having a third terminal.

The illustration in FIG. 3 shows an embodiment of an optocoupler OPK, including an energy source VQ, which has a stacked arrangement of the two partial sources VQ1 and VQ2. Only the differences from the illustration in FIG. 1 are explained below.

Second terminal VSUP2 is disposed between the underside of first partial source VQ1 and the upper side of second partial source VQ2. A third terminal VSUP3 is disposed on the underside of second partial source VQ2. Second terminal VSUP2 may be compared with a center tap of a series circuit by connecting the two partial sources VQ1 and VQ2 in series. One advantage is that the voltage or the current of first partial source VQ1 may be tapped directly between first terminal VSUP1 and second terminal VSUP2. The voltage or the current of second partial source VQ2 may also be tapped directly between second terminal VSUP2 and third terminal VSUP3.

Expressed in a Boolean representation, the voltage behavior of the three terminals VSUP1, VSUP2 and VSUP3 corresponds to an OR operation, i.e. if one of transmitter diodes SD1 and SD2 or both transmitter diodes SD1 and SD2 irradiate the receiver unit, a first voltage VOUT1 may be measured at one of the two or at both partial sources VQ1 and VQ2.

It should be noted that first partial source VQ1 and second partial source VQ2 can each include at least one diode.

Figure 4:
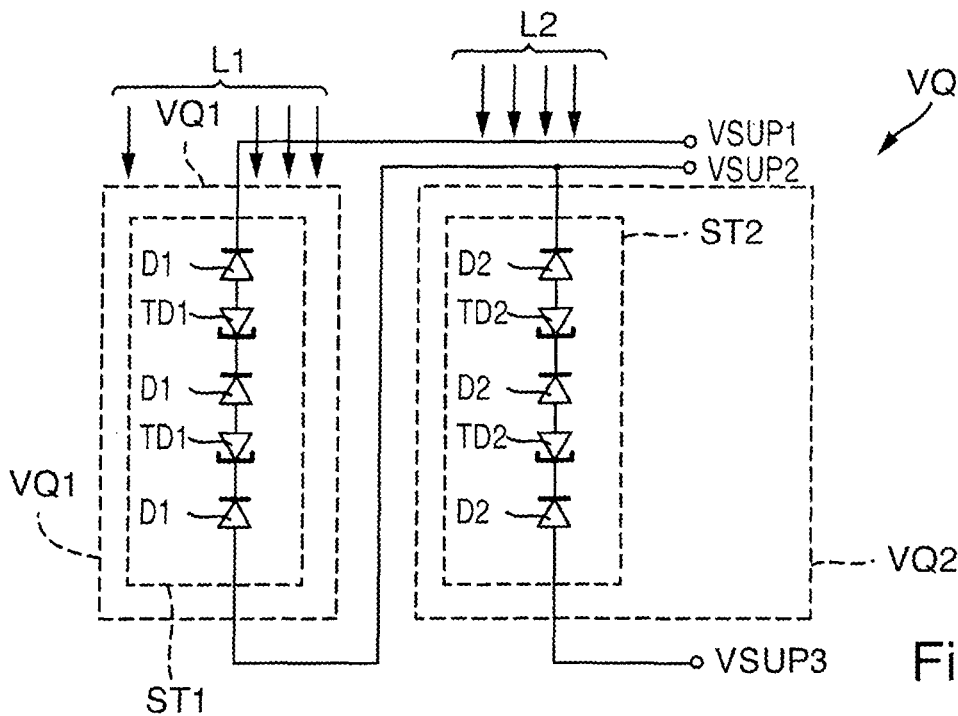
FIG. 4 shows an embodiment of an energy source, including a design arranged side by side of two series-connected partial sources, each including multiple series-connected diodes.

The illustration in FIG. 4 shows an embodiment of an energy source VQ, including partial sources VQ1 and VQ2 arranged side by side, first partial source VQ1 having a first stack ST1, and second partial source VQ2 having a second stack ST2. Only the differences from the illustration in FIG. 1 and the illustration in FIG. 3 are explained below.

First stack ST1 now has a first stacked, monolithic arrangement of series-connected first diodes D1 having a number N equal to three. A first tunnel diode TD1 is disposed between each of two directly consecutive first diodes D1.

The upper side of first partial source VQ1 is connected to first terminal VSUP1, and the underside of first partial source VQ1 is connected to second terminal VSUP2.

Second stack ST2 has a first stacked, monolithic arrangement of series-connected second diodes D2 having a number N equal to three. A second tunnel diode TD2 is disposed between each of two directly consecutive second diodes D2. The upper side of second partial source VQ2 is connected to second terminal VSUP2, and the underside of second partial source VQ2 is connected to third terminal VSUP3.

In an embodiment, the two stacks ST1 and ST2 have a different number of diodes with respect to each other, each connected in a series circuit. In an embodiment, at least first stack ST1 and/or second stack ST2 have more than three diodes D1 and D2 connected in a series circuit. In particular, the level of the voltage and the level of the current of energy source VQ may be scaled hereby. Number N is preferably in a range between four and eight. It is understood that the voltage of particular partial source VQ1 and VQ2 increases with an increasing number N, while the current of corresponding partial source VQ1 and VQ2 decreases.

Figure 5:
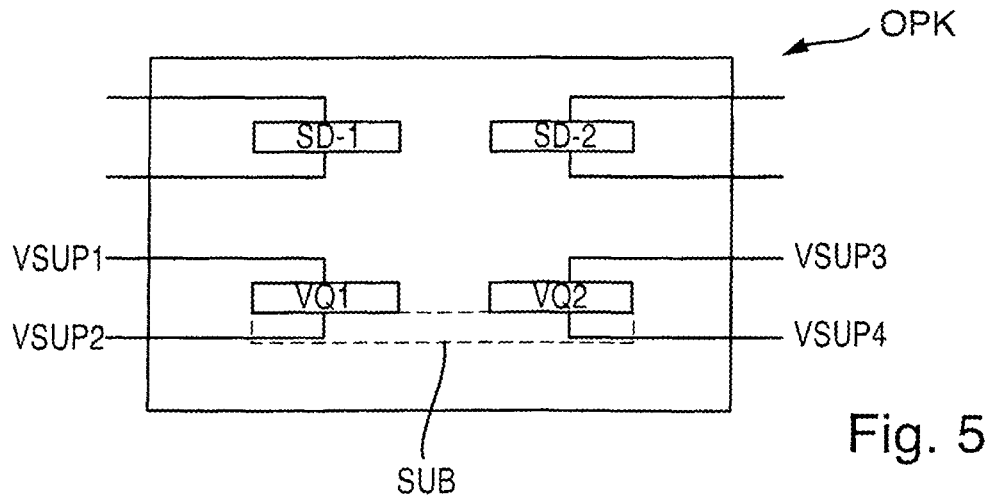
FIG. 5 shows an embodiment of an optocoupler, including a transmitter unit and a receiver unit with two separated partial sources.

The illustration in FIG. 5 shows an embodiment of optocoupler OPK, including an energy source VQ, which includes partial sources VQ1 and VQ2 arranged side by side. Only the differences from the illustration in FIG. 1 and the illustration in FIG. 3 are explained below.

First partial source VQ1 is situated at a lateral distance from second partial source VQ2 on a shared substrate SUB. First partial source VQ1 is connected to first terminal VSUP1 and to second terminal VSUP2. Second partial source VQ2 is connected to third terminal VSUP3 on the upper side and to a fourth terminal VSUP4 on the underside. This makes it possible to tap the current and the voltage of first partial source VQ1 independently of the current and voltage of second partial source VQ2. The two partial sources VQ1 and VQ2 are disposed in parallel to each other but are not connected in the present case.

Figure 6:
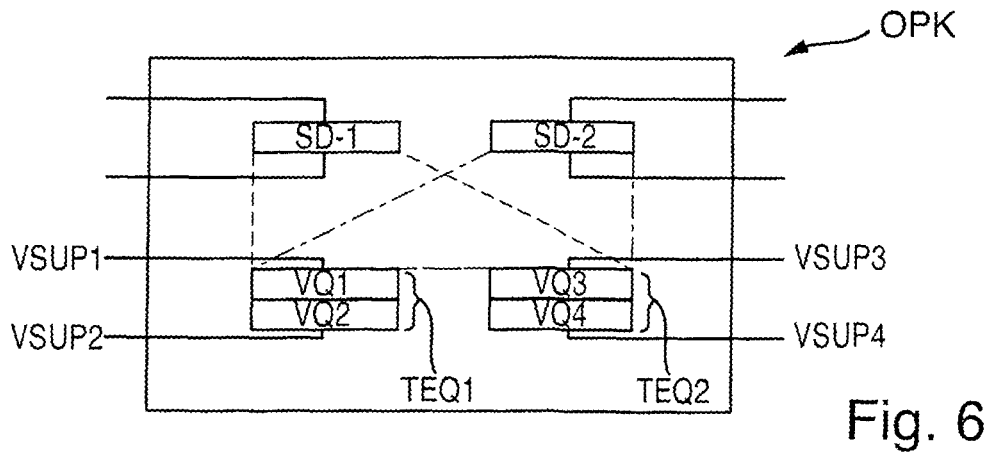
FIG. 6 shows an embodiment of an optocoupler, including a transmitter unit and a receiver unit with two separated partial energy sources.

The illustration in FIG. 6 shows an embodiment of optocoupler OPK, including an energy source VQ, which includes two partial energy sources TEQ1 and TEQ2 arranged side by side. Only the differences from the illustration in FIG. 1 and FIG. 5 are explained below.

First partial energy source TEQ1 is disposed at a lateral distance from second partial energy source TEQ2. An arrangement of the two partial energy sources TEQ1 and TEQ2 on a shared substrate is optional. Each of partial energy sources TEQ1 and TEQ2 includes first partial source VQ1 and second partial source VQ2 in a stacked arrangement.

First partial energy source TEQ1 is connected to first terminal VSUP1 and to second terminal VSUP2. Second partial energy source TEQ2 is connected to third terminal VSUP3 on the upper side and to fourth terminal VSUP4 on the underside. This makes it possible to tap the current and the voltage of first partial energy source TEQ1 independently of the current and voltage of second partial energy source TEQ2. The two partial energy sources TEQ1 and TEQ2 are disposed in parallel to each other but are not connected in the present case. The light of first transmitter diode SD1 and the light of second transmitter diode SD2 strike the upper sides of the two partial energy sources TEQ1 and TEQ2.

The illustration in FIG. 7 shows an embodiment of optocoupler OPK, including an energy source VQ, which includes an integrated normally-on transistor T1L. Only the differences from the illustration in FIG. 1 are explained below.

Second terminal VSUP2 is connected to gate G of transistor T1L. An external current source IQ1 is connected to source S of transistor T1L. The drain of transistor T1L is connected to a current terminal IOUT. Studies have shown that if one of transmitter diodes SD1 or SD2 illuminates receiver unit EM at current terminal IOUT, no second current IOUT2 may be measured, i.e. the channel of transistor T1L is cut off. Once receiver unit EM is not illuminated, a second current IOUT2 may be measured at current terminal IOUT. Expressed in a Boolean representation, the behavior corresponds to a negated OR (NOR) operation.

The illustration in FIG. 8 shows an embodiment of optocoupler OPK, including an energy source VQ, which includes an integrated normally-off transistor T1S. Only the differences from the illustration in FIG. 6 and the illustration in FIG. 7 are explained below.

First partial energy source TEQ1 is disposed at a lateral distance from second partial energy source TEQ2, but first partial energy source TEQ1 includes only one first partial source VQ1, while second partial energy source TEQ2 includes first partial source VQ1 and second partial source VQ2 in the stacked arrangement.

Third terminal VSUP3 is connected to the source of transistor T1S and first terminal VSUP1. Fourth terminal VSUP4 is connected to gate G of transistor T1S. Second terminal VSUP2 is connected to the drain of transistor T1S.

If one of the transmitter diodes SD1 or SD2 illuminates receiver unit EM, a second voltage VOUT2 may be measured between first terminal VSUP1 and second terminal VSUP2. If both transmitter diodes SD1 and SD2 illuminate receiver unit EM, i.e. both partial energy sources TEQ1 and TEQ2, transistor T1S is conductive and short-circuits first partial energy source TEQ1, so that no second voltage VOUT2 may be measured between first terminal VSUP1 and second terminal VSUP2. Even if neither of the two transmitter diodes SD1 and SD2 illuminate, no second voltage VOUT2 is also present between first terminal VSUP1 and second terminal VSUP2. Expressed in a Boolean representation, the behavior corresponds to an exclusive OR (XOR) operation.

In the illustration in FIG. 9, the Boolean operations, which are easy to implement, are summarized in the form of a table. It should be noted that, with the aid of the four basic operations, higher-order computing operations, such as addition and multiplication, may be carried out without a processor.

Figure 10:
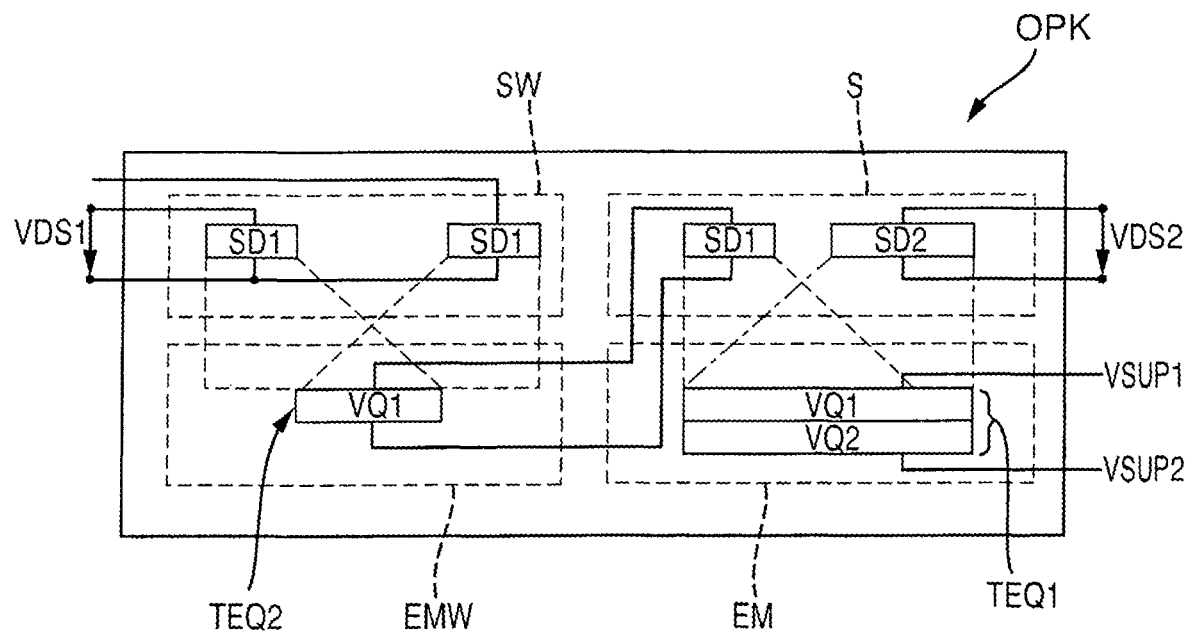
FIG. 10 shows an embodiment of an optocoupler, including a second connection of multiple units.

The illustration in FIG. 10 shows an embodiment of optocoupler OPK, including an energy source VQ, which has a first connection of multiple units. Only the differences from the illustration in FIG. 1 and the illustration in FIG. 6 are explained below.

Another transmitter unit SW having two additional first transmitter diodes SD1 and another receiver unit EMW are disposed in the housing of optocoupler OPK. The two additional transmitter diodes SD1 illuminate only second partial energy source TEQ2. The two additional transmitter diodes SD1 may be activated separately from the outside. Second partial energy source TEQ1 supplies the supply voltage of first transmitter diode SD1 in transmitter unit S, i.e. the two electrical terminals of second partial energy source TEQ2 are connected to the two electrical terminals of first transmitter diode SD1. Second supply voltage VDS2 may be applied from the outside to second transmitter diode SD2 of transmitter unit S with the aid of the two terminal contacts.

Transmitter diodes SD1 and SD2 of transmitter unit S illuminate only first partial energy source TEQ1. While first partial energy source TEQ1 contains the stacked arrangement of first partial source VQ1 on second partial source VQ2, second partial energy source TEQ2 contains only one first partial source VQ2. Moreover, only first partial energy source TEQ1 includes external terminals VSUP1 and VSUP2.

Figure 11:
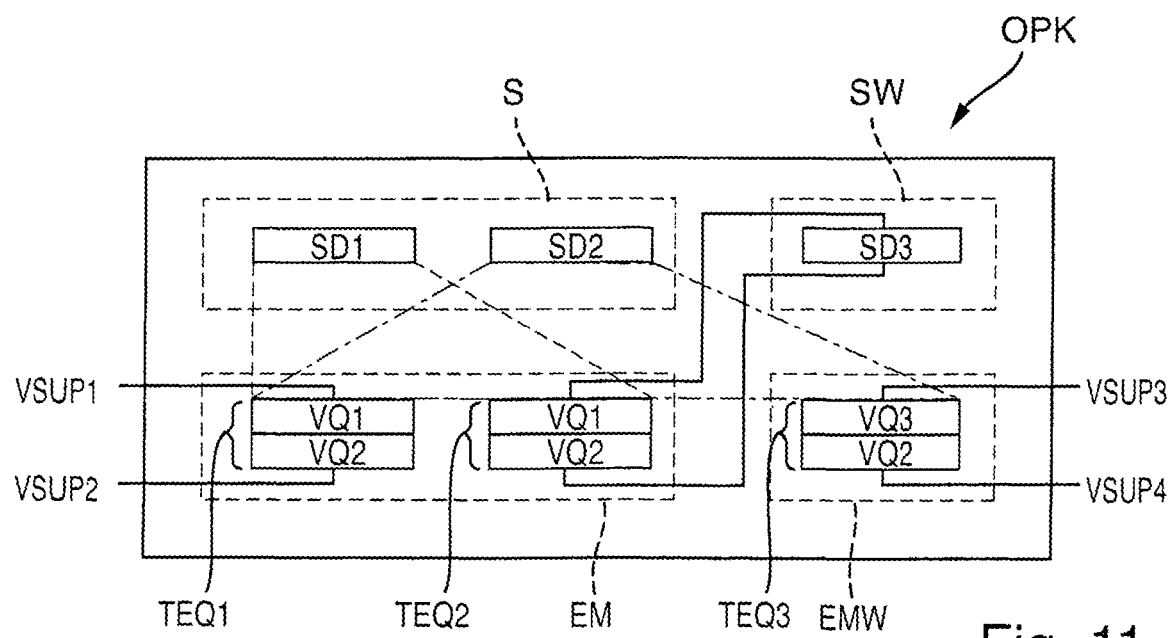
FIG. 11 shows an embodiment of an optocoupler, including a second connection of multiple units.

The illustration in FIG. 11 shows an embodiment of optocoupler OPK, including an energy source VQ, which has a first connection of multiple units. Only the differences from the illustration in FIG. 6 and the illustration in FIG. 10 are explained below.

Additional transmitter unit SW and additional receiver unit EMW are disposed in the housing of optocoupler OPK. First transmitter diode SD1 of transmitter unit S illuminates exclusively first partial energy source TEQ1 and second partial energy source TEQ2 of receiver unit EM. Second transmitter diode SD2 of transmitter unit S illuminates both receiver unit EM and additional receiver unit EMW.

Additional receiver unit EMW includes a third partial energy source TEQ3. Third partial energy source TEQ3 is connected externally to third terminal VSUP3 and to fourth terminal VSUP4. Third partial energy source TEQ3 includes a third partial source VQ3 and second partial source VQ2. Third partial source VQ3 includes at least one third diode and is disposed monolithically in the shape of a stack on second partial source VQ2. The third diode of third partial source VQ3 has a larger band gap than the other diodes D1 and D2.

Additional transmitter unit SW includes a third transmitter diode SD3. Third transmitter diode SD3 has a different third optical wavelength L3 from the two other transmitter diodes SD1 and SD2. Third optical wavelength L3 preferably has a shorter wavelength than the two other optical wavelengths L1 and L2. Third transmitter diode SD3 illuminates exclusively additional receiving unit EMW.

The two electrical terminals of second partial energy source TEQ2 of receiver unit EM are connected to the two terminals of third transmitter diode SD3, i.e. third transmitter diode SD3 illuminates only additional receiver unit EMW when second partial energy source TEQ2 supplies sufficient energy. The terminals of second partial energy source TEQ2 and third transmitter diode SD3 are available only within optocoupler OPK.

The two electrical terminals VSUP1 and VSUP2 of first partial energy source TEQ1 are available externally. The external terminals of receiver unit EM for the two transmitter diodes SD1 and SD2 are not illustrated.

Third partial energy source TEQ3 supplies a current at outputs VSUP3 and VSUP4 only when second partial source VQ2 and third partial source VQ3 are illuminated simultaneously.

The invention being thus described, it will be obvious that the same may be varied in many ways. Such variations are not to be regarded as a departure from the spirit and scope of the invention, and all such modifications as would be obvious to one skilled in the art are to be included within the scope of the following claim.

What is claimed is:
1. An optocoupler comprising:
a transmitter unit;
a receiver unit, the transmitter unit and the receiver unit being electrically isolated from each other and optically coupled with each other and integrated into a shared housing, the receiver unit having a first electrical terminal contact and a second electrical terminal contact, the receiver unit including an energy source, the energy source having a first partial source and a second partial source as current sources or as voltage sources,
wherein the transmitter unit includes at least one first transmitter diode having a first optical wavelength and a second transmitter diode having a second optical wavelength, the first optical wavelength differing from the second optical wavelength by a difference wavelength,
wherein the first partial source includes a first semiconductor diode and the second partial source includes a second semiconductor diode, each of the first or second partial sources having multiple semiconductor layers, the semiconductor layers for each of the first and second partial source being arranged in a shape of a stack, and each of the first and second partial sources having an upper side and an underside,
wherein the first semiconductor diode has an absorption edge adapted to the first optical wavelength, and the second semiconductor diode has an absorption edge adapted to the second optical wavelength, so that the first partial source generates energy when irradiated with the first optical wavelength and the second partial source generates energy when irradiated with the second optical wavelength,
wherein an underside of the first partial source is disposed on an upper side of the second partial source so that the two partial sources form a common stack having a front side and a back side, and
wherein a tunnel diode is formed between the two semiconductor diodes disposed one on top of the other, the two partial sources being connected in series,
wherein a first metallic contact, connected to a terminal contact, is formed on the upper side of the first partial source, and a second metallic contact is formed on an underside of the second partial source,
wherein the second metallic contact is formed over an entire surface on an underside of the substrate, wherein a substrate has an upper side, the upper side of the substrate being monolithically connected in an integral manner to the underside of the second partial source, and wherein the upper side of the substrate has a larger surface than the surface on the underside of the energy source so that a circumferential step is formed.

2. The optocoupler according to claim 1, wherein the first partial source and the second partial source are monolithically integrated.

3. The optocoupler according to claim 1, wherein radiation strikes the upper side of the first and second partial sources.

4. The optocoupler according to claim 1, wherein, in a stacked arrangement of the two partial sources, the second terminal contact is formed on a back of the common stack via a semiconductor substrate.

5. The optocoupler according to claim 1, wherein the receiver unit includes a normally-on transistor, a gate of the transistor being connected to the second terminal contact of the series-connected partial sources.

6. The optocoupler according to claim 1, wherein the receiver unit includes an evaluation unit, and the evaluation unit is in electrical operative connection with the two partial sources.

7. The optocoupler according to claim 1, wherein the first partial source is made up of a large number of first diodes, wherein the second partial source is made up of a large number of second diode, and wherein the two partial sources each have a source voltage greater than 2 volts at 300 K.

8. The optocoupler according to claim 1, wherein the first semiconductor diode includes InGaP, and wherein the second semiconductor diode includes GaAs or InGaAs.

9. The optocoupler according to claim 1, wherein multiple first partial sources and/or multiple second partial sources are formed, and wherein the first and second partial sources are spatially separated from each other.

10. The optocoupler according to claim 9, wherein one transmitter diode activates multiple first partial sources or multiple second partial sources.

* * * * *